United States Patent
Takahashi

(10) Patent No.: US 7,893,392 B2
(45) Date of Patent: Feb. 22, 2011

(54) LIGHT-RECEIVING CIRCUIT HAVING A PHOTODIODE MADE OF THIN FILMS AND A TRANSFERRING THIN FILM TRANSISTOR

(75) Inventor: Mitsuasa Takahashi, Kawasaki (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 695 days.

(21) Appl. No.: 11/588,348

(22) Filed: Oct. 27, 2006

(65) Prior Publication Data

US 2007/0109435 A1    May 17, 2007

(30) Foreign Application Priority Data

Nov. 14, 2005    (JP) .............................. 2005-329477

(51) Int. Cl.
*H01L 21/84*    (2006.01)
(52) U.S. Cl. ................................. 250/208.1; 250/214 R
(58) Field of Classification Search ............... 250/208.1, 250/214 R; 349/25, 28; 345/92, 45
See application file for complete search history.

(56) References Cited

U.S. PATENT DOCUMENTS

| | | | | |
|---|---|---|---|---|
| 4,823,178 A | * | 4/1989 | Suda | .......................... 257/444 |
| 6,507,010 B1 | * | 1/2003 | Yamazaki et al. | ......... 250/208.1 |
| 6,890,784 B2 | * | 5/2005 | Yamazaki et al. | ............. 438/30 |
| 6,972,221 B2 | * | 12/2005 | Takahashi | .................... 438/166 |
| 2003/0156087 A1 | * | 8/2003 | Boer et al. | ..................... 345/92 |
| 2004/0056204 A1 | * | 3/2004 | Tanaka et al. | .......... 250/370.09 |
| 2005/0078071 A1 | | 4/2005 | Chen | |
| 2008/0290253 A1 | * | 11/2008 | Childs | ..................... 250/208.1 |

FOREIGN PATENT DOCUMENTS

| | | |
|---|---|---|
| JP | H04-179270 | 6/1992 |
| JP | H06-132510 | 5/1994 |
| JP | 08-205034 | 8/1996 |
| JP | 2000-092396 | 3/2000 |
| JP | 2004-45879 | 2/2004 |

* cited by examiner

*Primary Examiner*—Tony Ko
(74) *Attorney, Agent, or Firm*—Young & Thompson

(57) ABSTRACT

A light-receiving circuit is provided which is capable of reducing component counts, improving light-receiving accuracy and increasing a dynamic range of an amount of received light. The light-receiving circuit includes a photodiode made of thin films formed on an insulating substrate, a transferring TFT (Thin Film Transistor) to transfer charges induced by the photodiode according to input light, a charge accumulating capacitor to accumulate transferred charges, and a reading TFT to transfer charges accumulated in the charge accumulating capacitor to a charge reading signal line.

20 Claims, 5 Drawing Sheets

LIGHT-RECEIVING CIRCUIT HAVING A PHOTODIODE MADE OF THIN FILMS AND A TRANSFERRING THIN FILM TRANSISTOR

BACKGROUND OF THE INVENTION

1. Field of the Invention

The present invention relates to a light-receiving circuit which is capable of reducing component counts by simplifying its circuit configurations that read out charges induced by a photodiode, of improving its light-receiving accuracy and increasing a dynamic range of an amount of received light.

The present application claims priority of Japanese Patent Application No. 2005-329477 filed on Nov. 14, 2005, which is hereby incorporated by reference.

2. Description of the Related Art

With recent technological progresses of manufacturing semiconductors, a semiconductor device forming an imaging device made up of a plurality of pixels such as a CMOS (Complementary Metal Oxide Semiconductor) sensor is in use. FIG. 5 is a diagram showing an example of a light-receiving circuit corresponding to a unit pixel in a conventional CMOS sensor. The light-receiving circuit includes a photodiode 100, a first accumulating capacitor 101, a transferring Tr (transistor) 102, a second accumulating capacitor 103, a resetting Tr 104, an amplifying Tr 105, a reading Tr 106, a transferring signal line 107, a resetting signal line 108, a reading signal line 109, and a vertical signal line 110 [see, for example, Patent Reference 1 (Japanese Patent Application No. 2000-092396)].

As shown in FIG. 5, in the conventional light-receiving circuit, the first accumulating capacitor 101 serves as a parasitic capacitor of the photodiode 100 and is connected through the transferring Tr 102 to the second accumulating capacitor 103. The second accumulating capacitor 103 is connected through the resetting Tr 104 to a terminal for a resetting potential $E_{RS}$ and further to a gate of the amplifying Tr 105. A change in a potential in the second accumulating capacitor 103 amplified by the amplifying Tr 105 is read into the vertical signal line 110 connected commonly to pixels in a row direction through the reading Tr 106.

In the light-receiving circuit shown in FIG. 5, charges generated in the photodiode 100 according to input light are accumulated in the first accumulating capacitor 101 and are then transferred, when the transferring Tr 102 is turned ON by a transferring pulse φ TX fed through the transferring signal line 107, to the second accumulating capacitor 103 and are accumulated therein. A change in potential caused by charges accumulated in the second accumulating capacitor 103 is amplified by the amplifying Tr 105 using the resetting potential $E_{RS}$ as a reference potential and is read out, when the reading Tr 106 is turned ON by a reading pulse φ RD, by the vertical signal line 110. A potential of the second accumulating capacitor 103 is reset to be the resetting potential $E_{RS}$ when the resetting Tr 104 is turned ON by the resetting pulse φ RD fed through the resetting signal line 108.

Moreover, a display device is disclosed in Patent Reference 2 (Japanese Patent Application Laid-open No. 2004-045879). The disclosed display device includes a pixel array section in which a plurality of signal lines and scanning lines are formed in a ranged manner, a signal line driving circuit to drive signal lines, a scanning line driving circuit to drive scanning lines, a detecting circuit to capture an image, an outputting circuit to output the image, and a sensor controlling circuit to control a sensor to capture images. In the display device, by mounting a plurality of sensors for each pixel to capture images, it is made possible to capture images with high resolution and by accumulating image data captured by the plurality of sensors and to accurately detect an amount of light received by a plurality of photodiodes by storing image data captured by a plurality of sensors into a buffer and further by arranging an array substrate, a facing substrate, and a backlight in this order, it is made to detect, with high accuracy, intensity of light reflected from paper, by using a plurality of photodiodes.

Also, a two-dimensional image sensor is disclosed in Patent Reference 3 (Japanese Patent Application Laid-open No. Hei 4-179270), which includes a photosensor array in which pixels each made up of a phototransistor, an accumulating capacitor, and a pixel switching transistor are arranged tow-dimensionally and rows of horizontal switching transistor to sequentially read signals from the photosensor array. The two-dimensional image sensor is so configured that, by mounting each light-shielding film for the pixel switching transistor and the horizontal switching transistor so as to be independent from each of these transistors, each of these transistors is in an electrically floating state.

Furthermore, a thin-film optical sensor is disclosed in Patent Application 4 (Japanese Patent Application Laid-open No. Hei 6-132510) which includes pixels each made up of a thin-film transistor to be used as optical sensor having a plurality of gate electrodes, a thin-film transistor to be for switching, and an accumulating capacitor connected to the thin-film transistor for the optical sensor and the thin-film transistor for switching. The thin film optical sensor is so configured that, by connecting a gate electrode on a drain electrode side of the thin-film transistor for the optical sensor to an electrode of the accumulating capacitor, both the electrodes are maintained at the same potential.

In such a conventional light-receiving circuit as shown in FIG. 5, many circuit elements and wirings including the resetting Tr 104, amplifying Tr 105, resetting signal line 108, wirings for resetting potentials (not shown) are required, thus causing a decrease in a manufacturing yield. Also, the conventional light-receiving circuit shown in FIG. 5 has another problem in that, since an amount of received light is captured as a voltage signal, the captured voltage is affected by a change in temperature, as a result, leading to a narrow dynamic range. Furthermore, a conventional CMOS sensor has still another problem. That is, the conventional CMOS sensor is formed on a silicon wafer via LSI (Large Scale Integration) processing, however, if the sensor is formed on a glass substrate, the sensor capability is affected by variations in characteristics of a TFT (Thin Film Transistor) such as its threshold value. Therefore, the conventional CMOS having LSI circuit configurations cannot be used as the light-receiving circuit to be formed on a glass substrate.

SUMMARY OF THE INVENTION

In view of the above, it is an object of the present invention to provide a light-receiving circuit which is capable of improving light-receiving accuracy and increasing a dynamic range of an amount of received light by accumulating charges induced by a photodiode in an accumulating capacitor and by reading accumulated charges as a current and by simplifying circuit configurations to reduce component counts and by reading not voltages but charges without the use of an amplifying TFT having large variations in a threshold value.

According to a first aspect of the present invention, there is provided a light-receiving circuit including:

a photodiode made of thin films formed on an insulating substrate;

a transferring TFT to transfer charges induced by the photodiode according to input light;

a charge accumulating capacitor to accumulate the transferred charges; and a reading TFT to transfer charges accumulated in the charge accumulating capacitor to a charge reading signal line.

According to a second aspect of the present invention, there is provided a light-receiving circuit including:

a photodiode made of thin films formed on an insulating substrate;

a transferring TFT (Thin Film Transistor) to transfer charges induced by the photodiode according to input light;

a charge accumulating capacitor to accumulate the transferred charges; and a reading TFT to transfer charges accumulated in the charge accumulating capacitor to a charge reading signal line, wherein a driving circuit for an imaging device is connected to an output side of the charge reading signal line and charges accumulated in the charge accumulating capacitor are discharged, by turning on the reading TFT, through the charge reading signal line to a driving circuit side and, when operations of the driving circuit are completed, a potential of the charge reading signal line is reset to be a GND (Ground) potential and operations of turning off the reading TFT are periodically repeated.

In the foregoing first and second aspects, a preferable mode is one wherein the photodiode, the transferring TFT, and the reading TFT include amorphous silicon, polysilicon, or partial-single-crystal polysilicon having partially a single crystal that are formed on the insulating substrate.

Also, a preferable mode is one wherein the transferring TFT and the reading TFT are shielded from light.

Also, a preferable mode is one wherein the insulating substrate is a glass substrate.

Also, a preferable mode is one wherein the insulating substrate is a plastic substrate.

Also, a preferable mode is one wherein a ground potential is provided on an anode side of the photodiode.

Also, a preferable mode is one wherein a ground potential is provided on a cathode side of the photodiode.

Also, a preferable mode is one wherein each of the transferring TFT and the reading TFT is an N-type transistor.

Also, a preferable mode is one wherein each of the transferring TFT and the reading TFT is a P-type transistor.

Furthermore, a preferable mode is one wherein an N-type transistor and a P-type transistor are used, in a mixed manner, as each of the transferring TFT and the reading TFT.

With the above configuration, it is made possible to reduce the number of circuit elements and wirings owing to simplified circuit configurations and to improve a manufacturing yield. Moreover, an amplifying TFT having large variations in a threshold value occurring when being formed on a glass substrate, or a like is not used and charges of the photodiode are accumulated in the charge accumulating capacitor and the charges accumulated in the charge accumulating capacitor are directly read into the charge reading signal line and, therefore, the large dependence of an output signal on temperature can be avoided and a dynamic range of an amount of received light can be increased accordingly.

In addition, with configurations as above, after charges accumulated in the charge accumulating capacitor are read, the periodical operation of turning off the charge reading TFT is repeated and, therefore, a one-step leeway is provided in terms of operations, which enables stability in operations even with high-speed operations.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

The light-receiving circuit of the present invention includes a photodiode made up of thin films and formed on an insulating substrate, a transferring TFT to transfer charges induced by the photodiode according to input light, a charge accumulating capacitor to accumulate transferred charges, a reading TFT to transfer charges accumulated in the charge accumulating capacitor to a charge reading signal line.

First Embodiment

Figure 1:
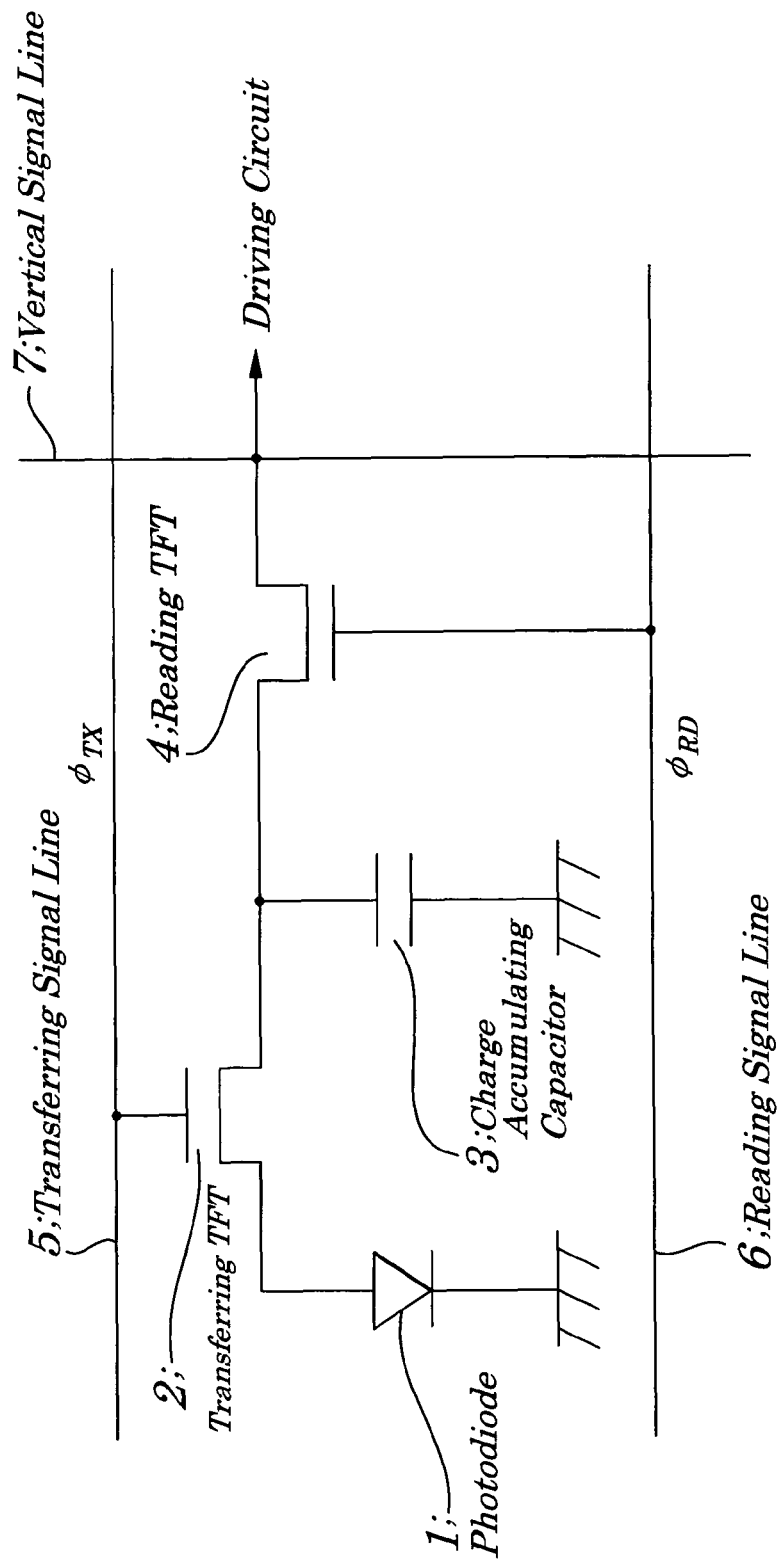
FIG. 1 is a diagram showing configurations of a light-receiving circuit according to an embodiment of the present invention.
Figure 2:
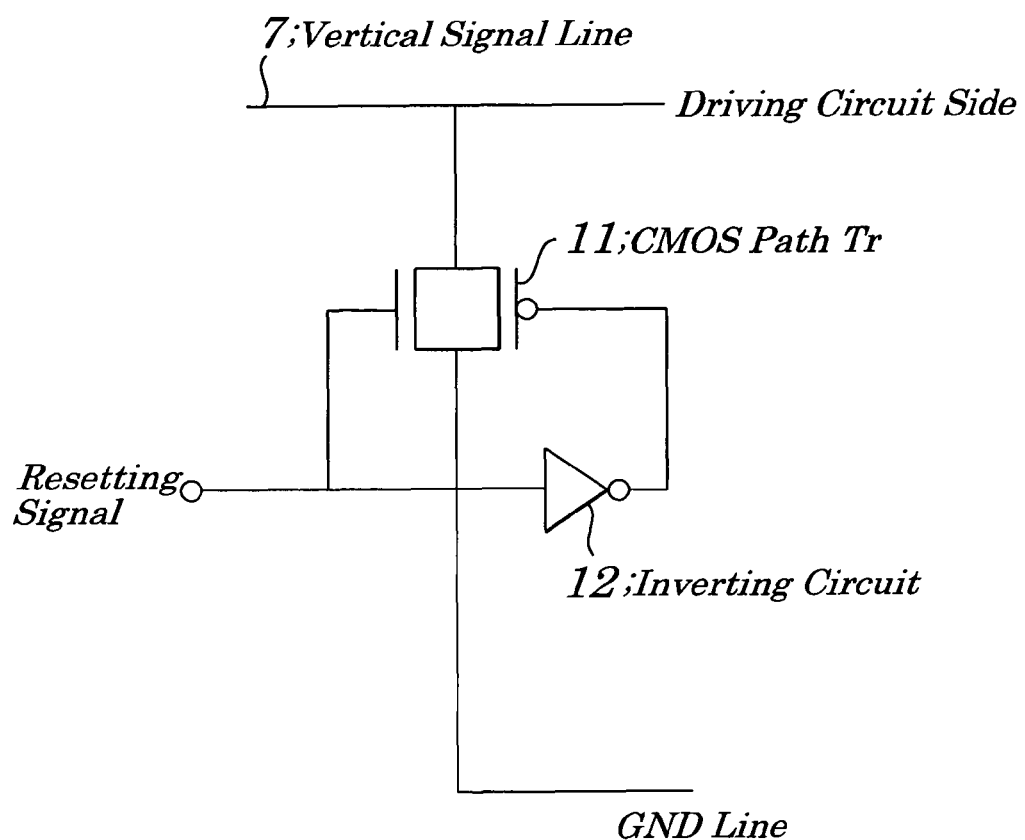
FIG. 2 is a diagram showing configurations of a resetting circuit according to the embodiment of the present invention.
Figure 3:
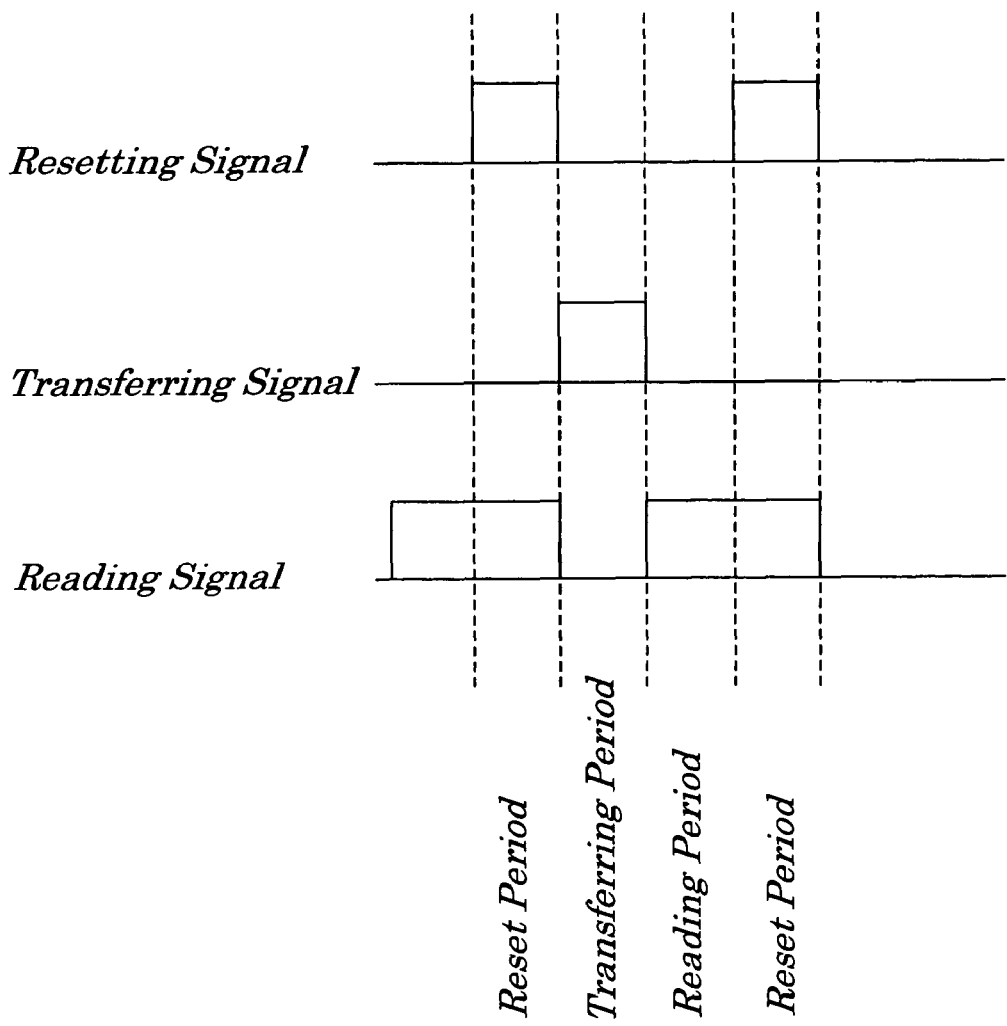
FIG. 3 is a timing chart explaining operations of the light-receiving circuit according to the embodiment of the present invention.
Figure 4:
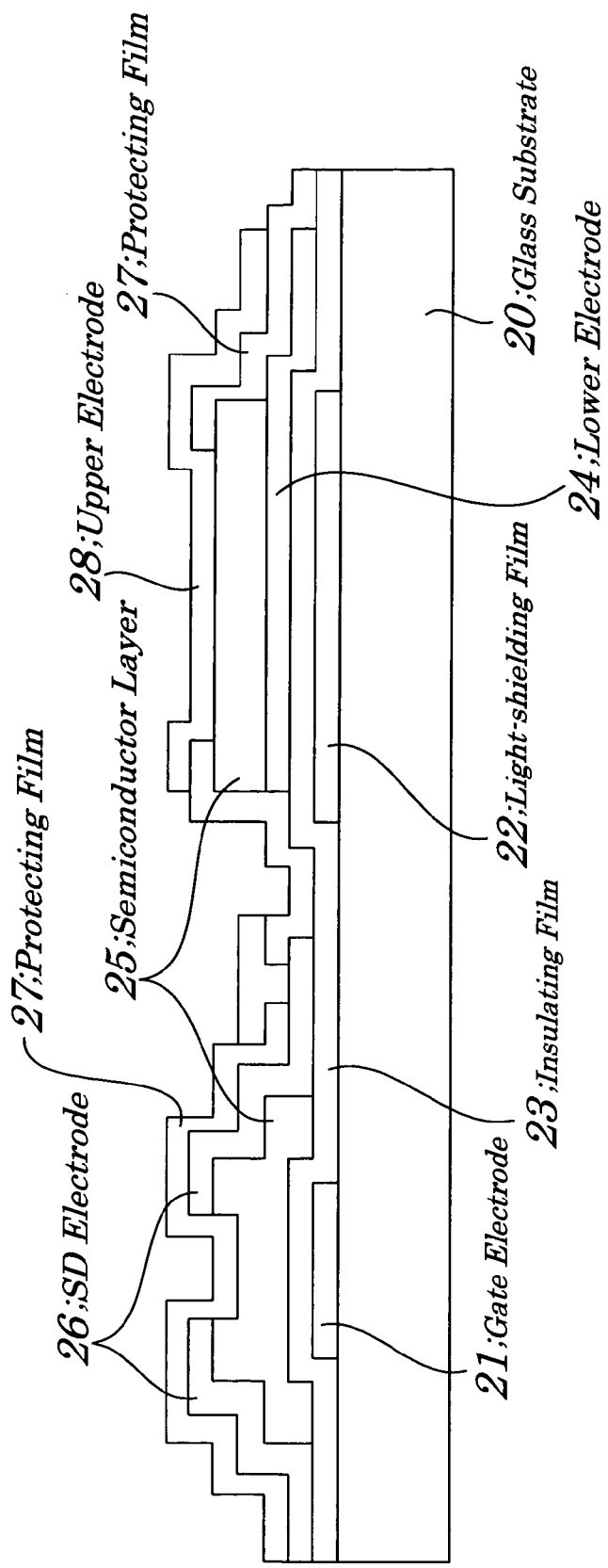
FIG. 4 is a diagram explaining a method of fabricating the light-receiving circuit according to the embodiment of the present invention.

FIG. 1 is a diagram showing configurations of a light-receiving circuit according to an embodiment of the present invention. FIG. 2 is a diagram showing configurations of a resetting circuit of the embodiment. FIG. 3 is a timing chart explaining operations of the light-receiving circuit according to the embodiment. FIG. 4 is a diagram explaining a method of fabricating the light-receiving circuit according to the embodiment.

The light-receiving circuit of the present invention, as shown in FIG. 1, mainly includes a photodiode 1, a transferring TFT 2, a charge accumulating capacitor 3, a reading TFT 4, a transferring signal line 5, a reading signal line 6, and a vertical signal line 7. The photodiode 1 is made up of a thin film and is connected through the transferring TFT 2 to the charge accumulating capacitor 3. The charge accumulating capacitor 3 is connected through the reading TFT 4 to the vertical signal line 7. Agate of the transferring TFT 2 is connected to the transferring signal line 5. A gate of the reading TFT 4 is connected to the reading signal line 6. The photodiode 1, transferring TFT 2, and reading TFT 4 are made of amorphous silicon, polysilicon, or polysilicon being partially a single crystal that are formed on an insulating substrate such as a glass substrate, plastic substrate, or a like. The transferring TFT 2 and reading TFT 4 are shielded from light.

FIG. 2 shows an example of configurations of a resetting circuit to reset a potential on an output side of the light-receiving circuit to be a GND (Ground) potential, which also includes a CMOS path Tr 11 and an inverting circuit 12. The CMOS path 11, when a resetting signal is at a high (H) level, discharges an electrical charge of the vertical signal line 7 to a GND line to reset a potential of the vertical signal line 7 to be a GND potential and, when the resetting signal is at a low(L) level, disconnects the vertical signal line 7 from the GND line so that a charge of the vertical signal line 7 is detected on a driving circuit side.

FIG. 3 is a timing chart explaining operations of the light-receiving circuit of the embodiment. The timing chart shows that, by application of a transferring signal to the transferring signal line 5 during a transferring period, charges of the photodiode 1 are accumulated through the transferring TFT 2 in the charge accumulating capacitor 3 and, by application of a reading signal to the reading signal line 6 during the next reading period and during the reset period, charges accumulated in the charge accumulating capacitor 3 are read by the vertical signal line 7 through the reading TFT 4, and further by application of a reset signal during the reset period, the charge accumulating capacitor 3 is connected by the resetting circuit through the reading TFT 4 and then the vertical signal line 7 to the GND line and thus a potential of the vertical signal line 7 is reset to be a GND potential and this periodical resetting operation is repeated thereafter.

Operations of the light-receiving circuit of the embodiment are described by referring to FIGS. 1 to 3 below. When a pulse voltage φ TX enough to turn on the transferring TFT 2 is applied as a transferring signal from the transferring signal line 5 to a gate of the transferring TFT 2 during the transferring period, charges induced by the photodiode 1 according to an input light are accumulated through the transferring TFT 2 in the charge accumulating capacitor 3. A potential of the charge accumulating capacitor 3, at time of termination of reading charges in a previous operation cycle, has been reset to be a GND potential through the CMOS path Tr 11. The transferring TFT 2 serves as a shutter to determine exposure time of the light-receiving circuit and, therefore, no mechanical shutter for the light-receiving circuit of the embodiment is required.

When a pulse voltage φ RD enough to turn on the reading TFT 4 is applied as a reading signal from the reading signal line 6 to a gate of the reading TFT 4 in the next step, charges accumulated in the charge accumulating capacitor 3 are read on the driving circuit side (not shown) through the vertical signal line 7. The vertical signal line 7 is ordinarily maintained at a GND potential and a negative potential is applied from the charge accumulating capacitor 3 only at time of reading and charges accumulated in the charge accumulating capacitor 3 are read into a driving circuit (not shown) made up of a constant-current integrating circuit until a potential of the vertical signal line 7 becomes a GND potential during the reset period. At time when operations of the driving circuit are completed and when the potential of the vertical signal line 7 is reset to be a GND potential, by stopping supply of the reading signal to turn off the reading TFT 4, resetting of the charge accumulating capacitor 3 is fully completed.

A method for fabricating the light-receiving circuit according to the embodiment will be described by referring to FIG. 4. A film of chromium (Cr) of which a gate electrode 21 and light-shielding film 22 are made is formed so as to be about 20 nm thick by a sputtering method on a glass substrate 20 and patterning on the film is performed by ordinary photoresist processing and etching processing. Next, an insulating film 23 made of silica ($SiO_2$) or silicon nitride ($SiN_x$), or a like is formed so as to have a thickness of about 40 nm by using a sputtering method or a plasma CVD (Chemical Vapor Deposition) method and then a film made of Cr is formed so as to be about 10 nm thick by sputtering and, patterning is performed on the film via photoresist processing and etching processing to form a lower electrode 24 of the photodiode 1.

Then, after plasma processing is performed on a surface of the lower electrode 24 of the photodiode 1 using gas containing diborane, a film of non-doped amorphous silicon (a-Si) with a thickness of about 200 nm and a film of phosphorous-doped $N^+$-a-Si with a thickness of about 50 nm are formed by a CVD method and then patterning is performed on the films by photoresist processing and dry etching using a method of RIE (Reactive Ion Etching) to form an island-shaped semiconductor layer 25.

Furthermore, a film of Cr is formed so as to be 1400 nm by sputtering and then patterning is performed on the film by photoresist processing and etching processing to form an SD (Source/Drain) electrode 26. Then, a silicon nitride ($SiN_x$) film serving as a protecting film (vassivation film) 27 is formed so as to be about 20 nm thick by the CVD method. After formation of a contact hole, a transparent conductive film made of ITO (Indium Tin Oxide) is formed so as to be about 50 nm thick by sputtering and patterning is performed by photoresist processing and wet etching using aqua regia to form pixel electrodes (not shown) and an upper electrode 28 of the photodiode.

Figure 5:
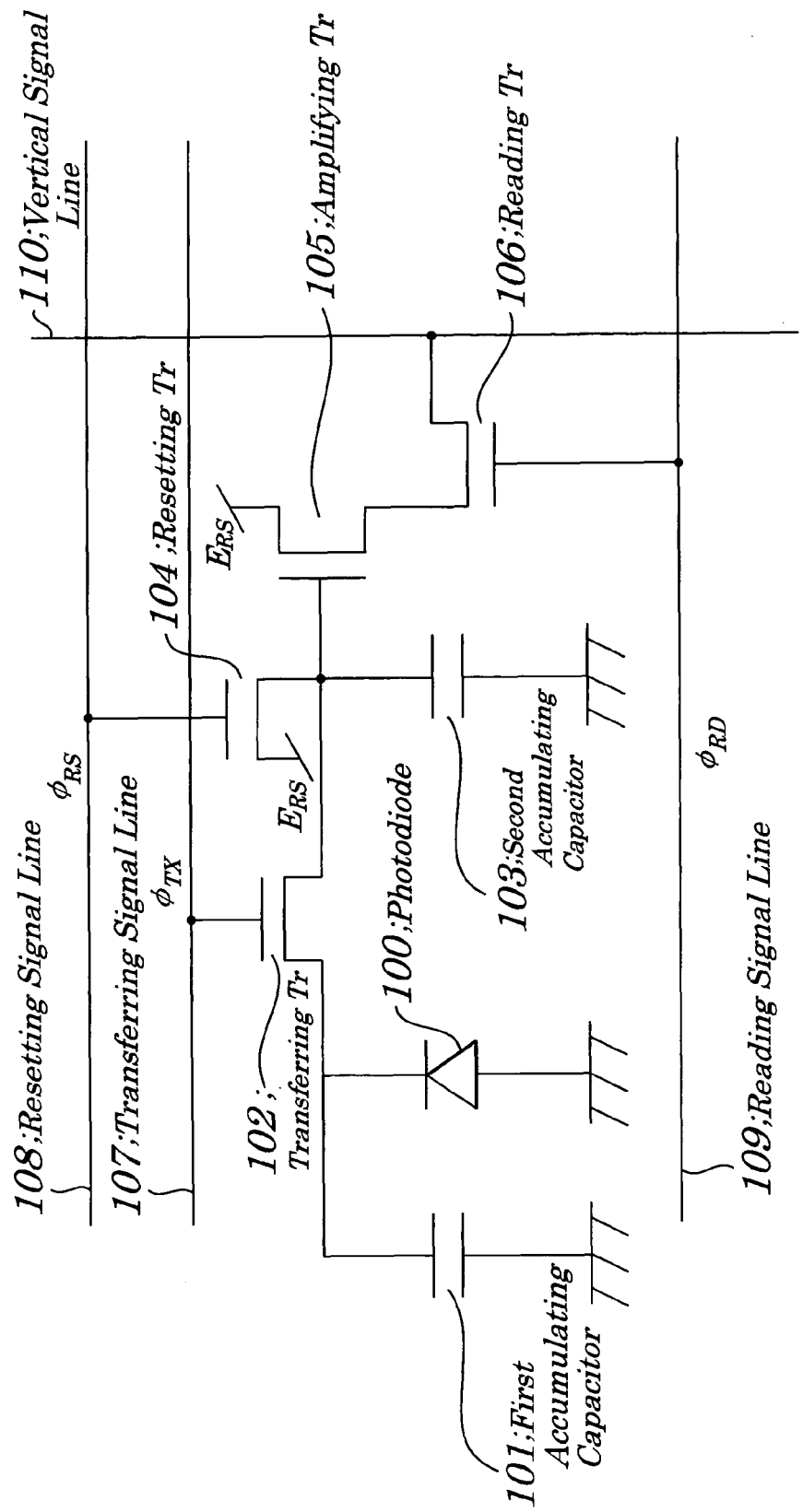
FIG. 5 is a diagram showing an example of a light-receiving circuit of a conventional CMOS sensor.

Next, advantages of the light-receiving circuit according to the embodiment are described by comparing with the conventional light-receiving circuit shown in FIG. 5. Since variations in characteristics of the TFT such as its threshold value are large when the TFT is formed on a glass substrate, in the embodiment, the amplifying TFT employed in the conventional light-receiving circuit shown in FIG. 5 is not used and charges accumulated in the charge accumulating capacitor are directly read out. This makes it possible to simplify the circuit configuration. An increase in dependence of photo-electromotive force on temperature caused by use of the amplifying TFT can be avoided and, as a result, light-receiving accuracy is improved. Owing to no use of the amplifying TFT, it is made possible to increase a dynamic range of an amount of received light in the photodiode.

Moreover, the use of the resetting TFT, resetting signal line, resetting potential line in the conventional light-receiving circuit is not required and the use of the amplifying TFT is omitted, as a result, the number of circuit elements and wirings is reduced, thereby improving a manufacturing yield.

Furthermore, though an operating speed of the TFT made of amorphous silicon, polysilicon, or a like is low, in the embodiment, while the reading TFTs are turned OFF periodically, amounts of charges of the diode can be read through the charge accumulating capacitor and, therefore, a one-step leeway is provided in terms of operations, which enables stability in operations even with high-speed operations.

It is apparent that the present invention is not limited to the above embodiments but may be changed and modified without departing from the scope and spirit of the invention. For example, in the above embodiment, a ground potential is provided on an anode side of the photodiode 1, however, the ground potential may be provided on a cathode side of the photodiode 1. Also, as the TFT, either of an N-type TFT or a P-type TFT may be used and also the N-type TFT and P-type TFT may be used in a mixed manner. The light-receiving circuit may be formed not only on a glass substrate but also on a plastic substrate. The light-receiving circuit of the present invention can be suitably used as a light-receiving circuit of a two-dimensional image sensor, X-ray imaging device, or a like.

What is claimed is:

1. A light-receiving circuit comprising:
a transparent insulating substrate;
a photodiode made of thin films formed on said transparent insulating substrate;
a light shielding film sandwiched between said transparent insulating substrate and said photodiode;
a transferring TFT (Thin Film Transistor) to transfer charges induced by said photodiode according to input light;
a charge accumulating capacitor to accumulate the transferred charges; and
a reading TFT to transfer charges accumulated in said charge accumulating capacitor to a charge reading signal line,
wherein one terminal of said photodiode is connected to a fixed potential, and another terminal of said photodiode is connected to a source/drain electrode of said transferring TFT.

2. The light-receiving circuit according to claim 1, wherein said photodiode, said transferring TFT, and said reading TFT comprise amorphous silicon, polysilicon, or partial-single-crystal polysilicon having partially a single crystal that are formed on said transparent insulating substrate.

3. The light-receiving circuit according to claim 1, wherein said transferring TFT and said reading TFT are shielded from light.

4. The light-receiving circuit according to claim 1, wherein said transparent insulating substrate is a glass substrate.

5. The light-receiving circuit according to claim 1, wherein said transparent insulating substrate is a plastic substrate.

6. The light-receiving circuit according to claim 1, wherein a ground potential is provided on an anode side of said photodiode.

7. The light-receiving circuit according to claim 1, wherein a ground potential is provided on a cathode side of said photodiode.

8. The light-receiving circuit according to claim 1, wherein each of said transferring TFT and said reading TFT is an N-type transistor.

9. The light-receiving circuit according to claim 1, wherein each of said transferring TFT and said reading TFT is a P-type transistor.

10. The light-receiving circuit according to claim 1, wherein an N-type transistor and a P-type transistor are used, in a mixed manner, as each of the transferring TFT and the reading TFT.

11. A light-receiving circuit comprising:
a transparent insulating substrate;
a photodiode made of thin films formed on said transparent insulating substrate;
a light shielding film sandwiched between said transparent insulating substrate and said photodiode;
a transferring TFT (Thin Film Transistor) to transfer charges induced by said photodiode according to input light;
a charge accumulating capacitor to accumulate the transferred charges; and
a reading TFT to transfer charges accumulated in said charge accumulating capacitor to a charge reading signal line,
wherein one terminal of said photodiode is connected to a constant potential, and another terminal of said photodiode is connected to a source/drain electrode of said transferring TFT, and
wherein a driving circuit for an imaging device is connected to an output side of said charge reading signal line and charges accumulated in said charge accumulating capacitor are discharged, by turning on said reading TFT, through said charge reading signal line to a driving circuit side and, when operations of said driving circuit are completed, a potential of said charge reading signal line is reset to be a GND (Ground) potential and operations of turning off said reading TFT are periodically repeated.

12. The light-receiving circuit according to claim 11, wherein said photodiode, said transferring TFT, and said reading TFT comprise amorphous silicon, polysilicon, or partial-single-crystal polysilicon having partially a single crystal that are formed on said transparent insulating substrate.

13. The light-receiving circuit according to claim 11, wherein said transferring TFT and said reading TFT are shielded from light.

14. The light-receiving circuit according to claim 11, wherein said transparent insulating substrate is a glass substrate.

15. The light-receiving circuit according to claim 11, wherein said transparent insulating substrate is a plastic substrate.

16. The light-receiving circuit according to claim 11, wherein a ground potential is provided on an anode side of said photodiode.

17. The light-receiving circuit according to claim 11, wherein a ground potential is provided on a cathode side of said photodiode.

18. The light-receiving circuit according to claim 11, wherein each of said transferring TFT and said reading TFT is an N-type transistor.

19. The light-receiving circuit according to claim 11, wherein each of said transferring TFT and said reading TFT is a P-type transistor.

20. The light-receiving circuit according to claim 11, wherein an N-type transistor and a P-type transistor are used, in a mixed manner, as each of the transferring TFT and the reading TFT.

* * * * *